(12) United States Patent
Muthukamatchi et al.

(10) Patent No.: US 10,850,390 B2
(45) Date of Patent: *Dec. 1, 2020

(54) DUAL ROBOT INCLUDING SPACED UPPER ARMS AND INTERLEAVED WRISTS AND SYSTEMS AND METHODS INCLUDING SAME

(71) Applicant: Applied Materials, Inc., Santa Clara, CA (US)

(72) Inventors: Karuppasamy Muthukamatchi, Madurai (IN); Damon K. Cox, Round Rock, TX (US); Jeffrey C. Hudgens, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/415,978

(22) Filed: May 17, 2019

(65) Prior Publication Data

US 2019/0270196 A1    Sep. 5, 2019

Related U.S. Application Data

(63) Continuation of application No. 15/619,424, filed on Jun. 9, 2017, now Pat. No. 10,500,719.
(Continued)

(51) Int. Cl.
*H01L 21/67* (2006.01)
*B25J 9/00* (2006.01)
(Continued)

(52) U.S. Cl.
CPC ............. *B25J 9/0087* (2013.01); *B25J 9/043* (2013.01); *H01L 21/67184* (2013.01); *H01L 21/67742* (2013.01)

(58) Field of Classification Search
CPC .......... H01L 21/67742; H01L 21/67184; B25J 9/043; B25J 9/0087
(Continued)

(56) References Cited

U.S. PATENT DOCUMENTS 5,096,364 A    3/1992 Messer et al.
6,102,649 A    8/2000 Ogawa et al.
(Continued)

FOREIGN PATENT DOCUMENTS

JP    05-100199 A    4/1993
JP    11-188670 A    7/1999
(Continued)

OTHER PUBLICATIONS

International Search Report and Written Opinion for International Application No. PCT/US2017/036902, 13 pages, dated Sep. 4, 2017.
(Continued)

*Primary Examiner* — Ronald P Jarrett
(74) *Attorney, Agent, or Firm* — Lowenstein Sandler LLP

(57) ABSTRACT

Robots including spaced upper arms are described. The robot includes first and second upper arms rotatable about a shoulder axis wherein the second upper arm is spaced from the first upper arm. The other robot components (first and second forearms, first and second wrist members, and first and second end effectors) are interleaved in the space between the first and second upper arms. Each of the first and second upper arms may be individually and independently controlled. Methods of operating the robot and electronic device processing systems including the robot are provided, as are numerous other aspects.

20 Claims, 10 Drawing Sheets

Related U.S. Application Data

(60) Provisional application No. 62/355,697, filed on Jun. 28, 2016.

(51) Int. Cl.
  B25J 9/04 (2006.01)
  H01L 21/677 (2006.01)

(58) Field of Classification Search
  USPC .................................................. 414/260.05
  See application file for complete search history.

(56) References Cited

U.S. PATENT DOCUMENTS

| | | | |
|---|---|---|---|
| 6,109,860 A * | 8/2000 | Ogawa | B25J 9/042 414/744.5 |
| 6,224,319 B1 | 5/2001 | Velikov et al. | |
| 7,688,017 B2 | 3/2010 | Hudgens | |
| 7,927,062 B2 | 4/2011 | Rice et al. | |
| 8,016,542 B2 | 9/2011 | Cox et al. | |
| 8,061,232 B2 | 11/2011 | Kroetz et al. | |
| 8,264,187 B2 | 9/2012 | Laceky et al. | |
| 8,692,500 B2 | 4/2014 | Laceky et al. | |
| 8,777,547 B2 | 7/2014 | Kremerman et al. | |
| 8,784,033 B2 | 7/2014 | Kremerman et al. | |
| 9,076,829 B2 | 7/2015 | Brodine et al. | |
| 9,076,830 B2 | 7/2015 | Kremerman et al. | |
| 9,147,590 B2 | 9/2015 | Pietrantonio et al. | |
| 2010/0178146 A1 | 7/2010 | Kremerman et al. | |
| 2012/0213615 A1 | 8/2012 | Sakaue | |
| 2013/0115028 A1 | 5/2013 | Kremerman et al. | |
| 2013/0121798 A1 | 5/2013 | Hosek | |
| 2013/0149076 A1 | 6/2013 | Cox et al. | |
| 2013/0272823 A1 | 10/2013 | Hudgens et al. | |
| 2014/0010625 A1 | 1/2014 | Hudgens et al. | |
| 2014/0150592 A1 | 6/2014 | Kremerman | |
| 2014/0154038 A1 | 6/2014 | Hudgens et al. | |
| 2014/0271055 A1 | 9/2014 | Weaver et al. | |
| 2014/0286736 A1 | 9/2014 | Kremerman et al. | |
| 2014/0286741 A1 | 9/2014 | Kremerman et al. | |
| 2014/0365004 A1 | 12/2014 | Hosek et al. | |
| 2015/0190933 A1 | 7/2015 | Kremerman | |
| 2017/0115555 A1 | 4/2017 | Hofmann et al. | |
| 2017/0117171 A1 | 4/2017 | Wirth | |
| 2017/0294335 A1 | 10/2017 | Kato et al. | |

FOREIGN PATENT DOCUMENTS

| | | |
|---|---|---|
| JP | H11-291184 A | 10/1999 |
| JP | 2001-332599 A | 11/2001 |
| JP | 2002-362738 A | 12/2002 |
| KR | 10-1382145 B | 4/2014 |
| WO | 2013/154863 | 10/2013 |
| WO | 2014/085479 | 6/2014 |
| WO | 2014113364 A1 | 7/2014 |

OTHER PUBLICATIONS

International Preliminary Report on Patentability of International Application No. PCT/US2017/036902, 9 pages, dated Jan. 10, 2019.

* cited by examiner

DUAL ROBOT INCLUDING SPACED UPPER ARMS AND INTERLEAVED WRISTS AND SYSTEMS AND METHODS INCLUDING SAME

RELATED APPLICATIONS

This application is a continuation of, and claims priority from, U.S. Non-Provisional patent application Ser. No. 15/619,424, filed Jun. 9, 2017, entitled "DUAL ROBOT INCLUDING SPACED UPPER ARMS AND INTERLEAVED WRISTS AND SYSTEMS AND METHODS INCLUDING SAME", which claims the benefit of and priority from U.S. Provisional Patent Application No. 62/355,697, filed Jun. 28, 2016, entitled "DUAL ROBOT INCLUDING SPACED UPPER ARMS AND INTERLEAVED WRISTS AND SYSTEMS AND METHODS INCLUDING SAME", both of which are hereby incorporated herein by reference in their entirety for all purposes.

FIELD

Embodiments of the present disclosure relate to electronic device manufacturing, and more specifically to robots adapted to transport substrates between chambers.

BACKGROUND

Electronic device manufacturing systems may include process tools having multiple chambers, such as process chambers and one or more load lock chambers. Such process chambers may be used to carry out any number of processes on the substrates (e.g., silicon-containing wafers, both patterned and unpatterned, masked wafers, glass plates, silica-containing articles, or the like) such as deposition, oxidation, nitration, etching, polishing, cleaning, lithography, metrology, or the like.

Within such process tools, a plurality of such chambers may be distributed about a transfer chamber, for example. A multi-arm robot may be housed within the transfer chamber and may be configured and adapted to transport substrates between the various chambers. For example, transfers may be between process chambers, or between process chambers and the one or more load lock chambers. Slit valves may be located at the entries into each respective chamber. Efficient and precise transport of substrates between these chambers is sought after to improve system throughput.

In particular, any improvement to systems, apparatus, and methods that provide for increased functionality is welcomed.

SUMMARY

In a first embodiment, a robot is provided. The robot includes a first upper arm rotatable about a shoulder axis, a second upper arm vertically spaced from the first upper arm and rotatable about the shoulder axis, a first forearm vertically located between the first upper arm and the second upper arm and adapted for rotation relative to the first upper arm about a second axis at a position offset from the shoulder axis, a second forearm vertically located between the first upper arm and the second upper arm and adapted for rotation relative to the second upper arm about a third axis at a position offset from the shoulder axis, a first wrist member vertically located between the first upper arm and the second upper arm and adapted for rotation relative to the first forearm about a fourth axis at a position offset from the second axis, and a second wrist member vertically located between the first upper arm and the second upper arm and adapted for rotation relative to the second forearm about a fifth axis at a position offset from the third axis.

According to another embodiment, an electronic device processing system is provided. The electronic device processing system includes a transfer chamber, a robot at least partially disposed within the chamber and adapted to transport substrates to and from process chambers coupled to the transfer chamber, the robot including a first upper arm rotatable about a shoulder axis, a second upper arm vertically spaced from the first upper arm and rotatable about the shoulder axis, a first forearm vertically located between the first upper arm and the second upper arm and adapted for rotation relative to the first upper arm about a second axis at a position offset from the shoulder axis, a second forearm vertically located between the first upper arm and the second upper arm and adapted for rotation relative to the second upper arm about a third axis at a position offset from the shoulder axis, a first wrist member vertically located between the first upper arm and the second upper arm and adapted for rotation relative to the first forearm about a fourth axis at a position offset from the second axis, and a second wrist member vertically located between the first upper arm and the second upper arm and adapted for rotation relative to the second forearm about a fifth axis at a position offset from the third axis.

In yet another embodiment, a method of transporting substrates within an electronic device processing system is provided. The method of transporting substrates includes providing a robot including a first upper arm rotatable about a shoulder axis, a second upper arm vertically spaced from the first upper arm and rotatable about the shoulder axis, a first forearm vertically located between the first upper arm and the second upper arm and adapted for rotation relative to the first upper arm about a second axis at a position offset from the shoulder axis, a second forearm vertically located between the first upper arm and the second upper arm and adapted for rotation relative to the second upper arm about a third axis at a position offset from the shoulder axis, a first wrist member vertically located between the first upper arm and the second upper arm and adapted for rotation relative to the first forearm about a fourth axis at a position offset from the second axis, and a second wrist member vertically located between the first upper arm and the second upper arm and adapted for rotation relative to the second forearm about a fifth axis at a position offset from the third axis, independently rotating the first upper arm to extend the first end effector radially into a first chamber, and independently rotating the second upper arm to extend the second end effector radially into a second chamber.

Numerous other features are provided in accordance with these and other embodiments of the disclosure. Other features and aspects of embodiments of the disclosure will become more fully apparent from the following detailed description, the accompanying drawings, and the claims.

DETAILED DESCRIPTION

As discussed above, in electronic device manufacturing processing it is desirable to provide precise and rapid transport of substrates between various locations (e.g., between chambers). To improve processing speed, dual-bladed robots have been used, i.e., robots having a blade-over-blade configuration, wherein substrate exchanges at a chamber can take place rapidly and without making a rotational move. In particular, the pick is accomplished by one end effector and the place is accomplished by the other end effector of the dual-bladed robot.

Existing selective compliance assembly robot arm (SCARA) robots, such as a dual SCARA robot found in U.S. Pat. No. 9,147,590, provides an acceptable level of throughput and precision, but cannot be independently rotated without interference between the elbow joints at certain locations. Thus, their functionality and range of motion is somewhat limited, and longer-than-necessary moves may be made for certain exchange maneuvers.

Embodiments of the present disclosure provide dual-blade robots that include a configuration wherein each of the robot arm assemblies (including upper arm, forearm, and wrist) can be rotated without any interference. In particular, according to one or more embodiments of the disclosure, a robot is provided including first and second upper arms rotatable about a shoulder axis wherein the second upper arm is spaced (e.g., vertically spaced) from the first upper arm. The other robot components (first and second forearms, first and second wrist members, and first and second end effectors) are received vertically spaced between the first and second upper arms. Each of the first and second upper arms and first and second forearms may be individually and independently controlled.

This highly-functional configuration enables the robot to rapidly move to any location with a smallest rotational move. Thus, efficiency and throughput may be enhanced.

Further details of various aspects of the robot, electronic device processing systems including the robot, and methods of operating the robot according to example embodiments are described with reference to FIGS. 2A-5 herein.

Figure 1:
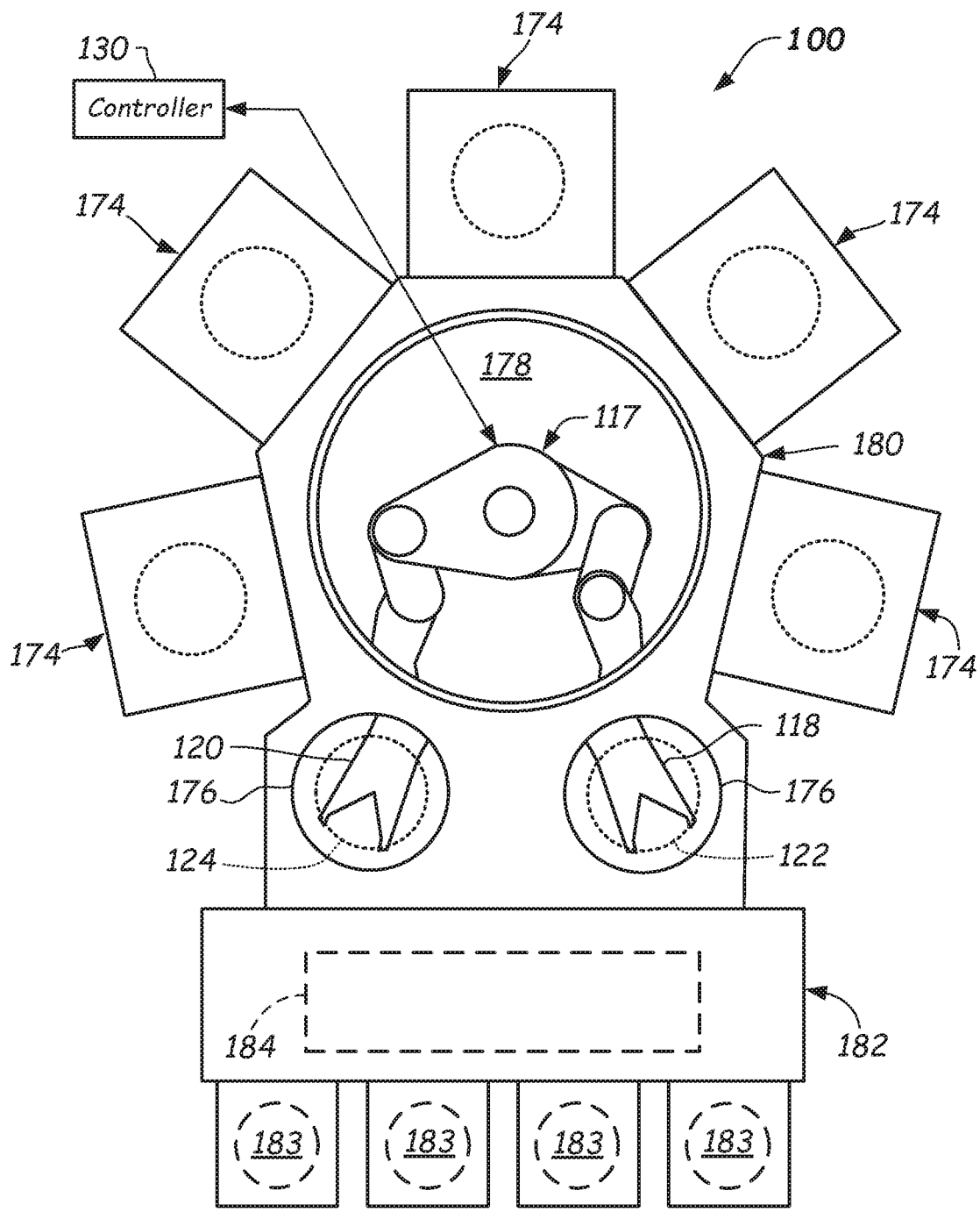
FIG. 1 illustrates a top view of an electronic device processing system including a dual robot according to one or more embodiments.

Referring now to FIG. 1, a first example embodiment of an electronic device processing system 100 is disclosed. The electronic device processing system 100 is useful, and may be configured and adapted, to transfer substrates (e.g., substrates 122, 124) to and from various chambers, such as into and out of process chambers 174, and/or into and out of load lock chambers 176, for example. However, the robot 117 may be useful in other environments where rapid movement of articles between locations is desired.

In one aspect, an electronic device processing system 100 is provided. The electronic device processing system 100 may include a transfer chamber 178 and a robot 117 at least partially contained in the transfer chamber 178, wherein the robot 117 is adapted to transport substrates 122, 124 to and from process chambers 174 and load lock chambers 176. The robot 117 is constructed as described herein.

The electronic device processing system 100 includes a mainframe housing 180 including the transfer chamber 178. The transfer chamber 178 may include top, bottom, and side walls, and, in some embodiments, may be maintained at a vacuum, for example. As shown, the top (e.g., lid) is removed. The destination locations for pick or place of the substrates 122, 124 may be any two of the process chambers 174, or any two of the load lock chambers 176.

As shown in FIG. 1, the robot 117 is shown placing substrates 122, 124 in load lock chambers 176, in unison. However, the robot 117 may service with the first end effector 118 a process chamber 174 while the second end effector 120 may service a load lock chamber 176, or vice versa. Similarly, each of the first end effector 118 and the second end effector 120 may service any two of the process chambers 174 at once. Process chambers 174 may be adapted to carry out any number of processes on the substrates 122, 124 and other substrates, such as deposition, oxidation, nitration, etching, polishing, cleaning, lithography, metrology, or the like. Other processes may be carried out.

The load lock chambers 176 may be adapted to interface with a factory interface 182 or other system component that may receive substrates from one or more substrate carriers 183 (e.g., Front Opening Unified Pods (FOUPs)) docked at one or more load ports of the factory interface 182. A load/unload robot 184 (shown as a dotted box) may be used to transfer various substrates between the substrate carriers 183 and the load lock chambers 176. Because of the complete lack of interference between the various arms of the robot 117, the moves between process chambers and load lock chambers can be made in the minimum amount of rotation. Moreover, if desired, moves can be made by each of the first end effector 118 and the second end effectors 120 such that the substrate 124 never lies directly over top of substrate 122, thus reducing the risk that any particles may fall from substrate 124 and come to rest on substrate 122. The first end effector 118 and the second end effector 120 may be operable to extend and retract in unison, one on top of the other, just like a dual-bladed SCARA robot of the prior art, as well. Thus, it should be recognized that each of the respective first end effector 118 and the second end effector 120 have a mutually exclusive work envelope that does not depend on where the other is located.

In the depicted embodiment of FIG. 1, the robot 117 is shown as being operable in a transfer chamber 178. However, it should be recognized that this embodiment of robot 117, may advantageously be used in other areas of electronic device manufacturing, such as in a factory interface 182 wherein the robot 117 may transport substrates between load ports and load lock chambers 176, for example. The robot 117 described herein is also capable of other transporting uses.

Now referring to FIGS. 2A-2G, the robot 117 may include a base 201 that may include a flange or other attachment features adapted to be attached and secured to a wall (e.g., a floor) of the mainframe housing 180 (FIG. 1). The robot 117 includes a first upper arm 202 and a second upper arm 204, which, in the depicted embodiment, are each substantially rigid cantilever beams. The first upper arm 202 is configured and adapted to be independently rotated about a shoulder axis 203 relative to the base 201 in a clockwise or counterclockwise rotational direction. Likewise, the second upper arm 204 is configured and adapted to be independently rotated about the shoulder axis 203 relative to the base 201 in both the clockwise or counterclockwise rotational direction. Rotation of the first upper arm 202 and the second upper arm 204 may be +/−360 degrees or more about the shoulder axis 203 and may be accomplished by motor 226 as commanded by the controller 130. The second upper arm 204 is vertically spaced from the first upper arm 202.

In the depicted embodiment, the shoulder axis 203 is stationary. This embodiment of robot 117 does not include Z-axis capability and should be used with lift pins, moving platforms, or the like in the various process chambers 174 and load lock chambers 176 (FIG. 1) to accomplish the substrate exchange. However, other embodiments may include Z-axis capability, as further described herein.

Mounted and rotationally coupled at a first position spaced from the shoulder axis 203 (e.g., at an outboard end of the first upper arm 202), is a first forearm 206. The first forearm 206 is configured and adapted to be rotated in an X-Y plane relative to the first upper arm 202 about a second axis 205 located at the first position. The first forearm 206 is independently rotatable in the X-Y plane relative to the first upper arm 202 by a first forearm drive assembly (FIG. 2F). The first forearm 206 is vertically located between the first upper arm 202 and the second upper arm 204.

Mounted and rotationally coupled at a position spaced from the shoulder axis 203 (e.g., at an outboard end of the second upper arm 204), is a second forearm 208. The second forearm 208 is configured and adapted to be rotated in an X-Y plane relative to the second upper arm 204 about a third axis 207 located at the spaced position. The second forearm 208 is rotatable in the X-Y plane relative to the second upper arm 204 by a second forearm drive assembly. The second forearm 208 is vertically located between the first upper arm 202 and the second upper arm 204.

In particular, the first forearm 206 and second forearm 208 are configured and adapted to be rotated in either a clockwise or counterclockwise rotational direction about the second axis 205 and the third axis 207, respectively. Rotation may be +/−about 140 degrees. As shown in FIG. 2C the first forearm 206 and second forearm 208 are located at different vertical locations between the first and second upper arms 202, 204 and do not interfere with one another when being independently rotated via rotation of the first and second upper arms 202, 204.

Located at a position spaced (e.g., offset) from the second axis 205 (e.g., rotationally coupled on an outboard end of the first forearm 206) is a first wrist member 210. The first wrist member 210 is configured and adapted for translation in the X-Y plane, such as relative to the base 201. In particular, the respective drive system and control enables pure translation along the Y direction, such that pick and place operations may be performed.

The first wrist member 210 may be coupled to the first end effector 118. The coupling may be by way of fasteners, the same as fasteners 215 shown in FIG. 2B. In some embodiments, the first wrist member 210 and the first end effector 118 and the second wrist member 212 and second end effector 120 may be coupled by being made integral with one another, i.e., from a same piece of material. The first wrist member 210 is configured and adapted for relative rotation about a fourth axis 209 relative to the first forearm 206. The first end effector 118 may be configured adapted to carry and transport a substrate 122 during pick and/or place operations.

Rotation of first wrist member 210, and thus the first end effector 118, may be imparted by a first wrist member drive assembly. The first wrist member 210 is configured and adapted for rotation relative to the first forearm 206 in either a clockwise or counterclockwise rotational direction about the fourth axis 209 by the first wrist member drive assembly. Rotation may be +/−about 70 degrees. In particular, relative rotation between the first forearm 206 and the first upper arm 202 causes the first wrist member 210, coupled first end effector 118, and supported substrate 122 to translate in the Y direction (See FIG. 2A. Such translation may be into the process chamber 174 as shown in FIG. 3D, for example.

Located at a position spaced (e.g., offset) from the third axis 207 (e.g., rotationally coupled on an outboard end of the second forearm 208) is a second wrist member 212. The second wrist member 212 is configured and adapted for translation in the X-Y plane, such as relative to the base 201. In particular, the respective drive system and control enables pure translation along the Y direction, such that pick and place operations may be performed.

Translation of the second wrist member 212, and thus the second end effector 120 and supported substrate 124, may be imparted by a second wrist member drive assembly. The second wrist member 212 is configured and adapted for rotation relative to the second forearm 208 in either a clockwise or counterclockwise rotational direction about the fifth axis 211 by the second wrist member drive assembly. Rotation may be +/−about 70 degrees. In particular, relative rotation between the second forearm 208 and the second upper arm 204 causes the second wrist member 212 and coupled second end effector 120 as well as supported substrate 124 to translate in the Y direction. Such translation may be into the process chamber 174 as shown in FIG. 3D, for example.

Figure 2A:
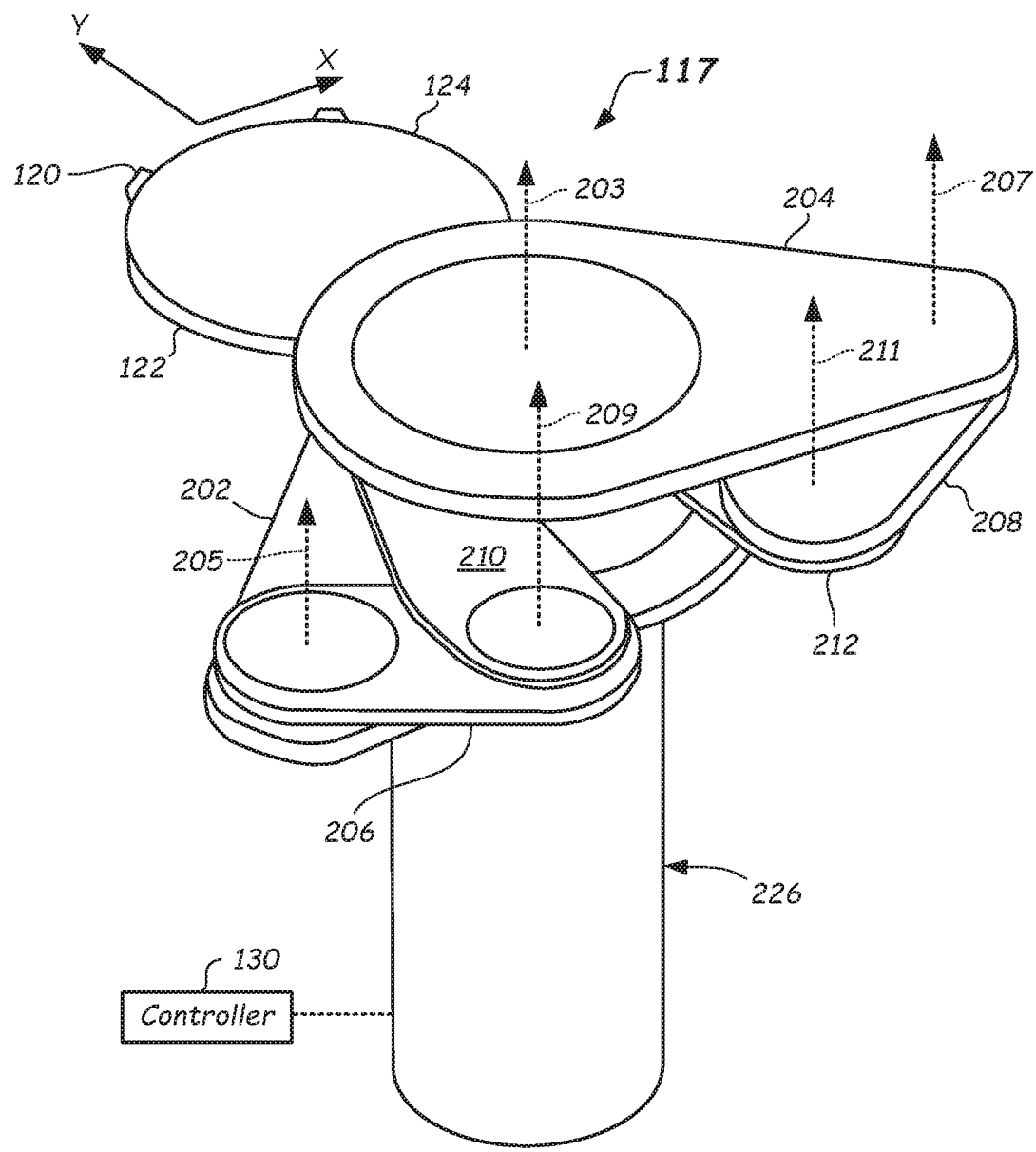
FIG. 2A illustrates an isometric view of a dual robot according to one or more embodiments.
Figure 2B:
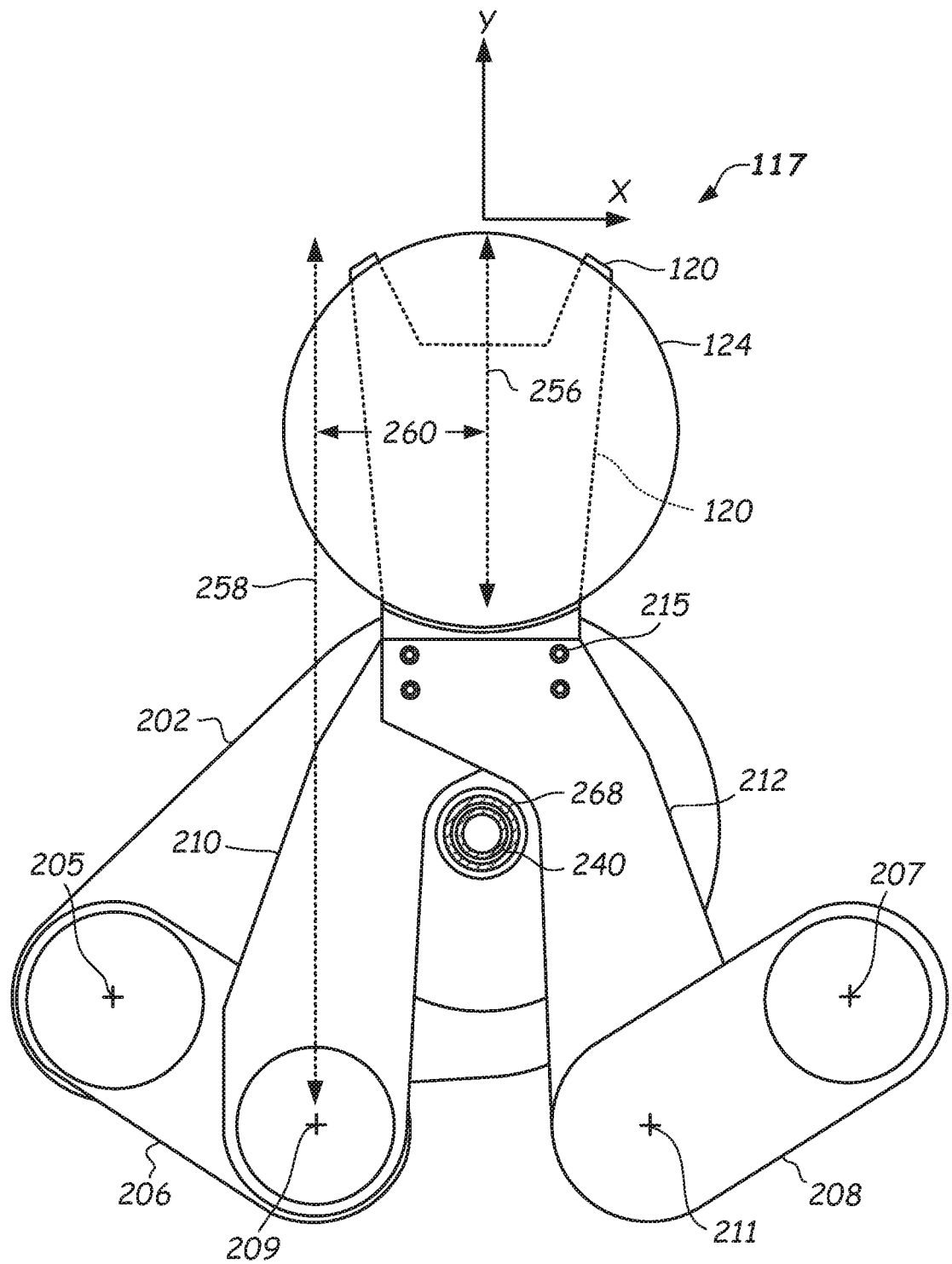
FIG. 2B illustrates a top plan view of a dual robot with a second upper arm removed to illustrate a retracted orientation of the dual robot and configuration of the wrist members according to one or more embodiments.
Figure 2C:
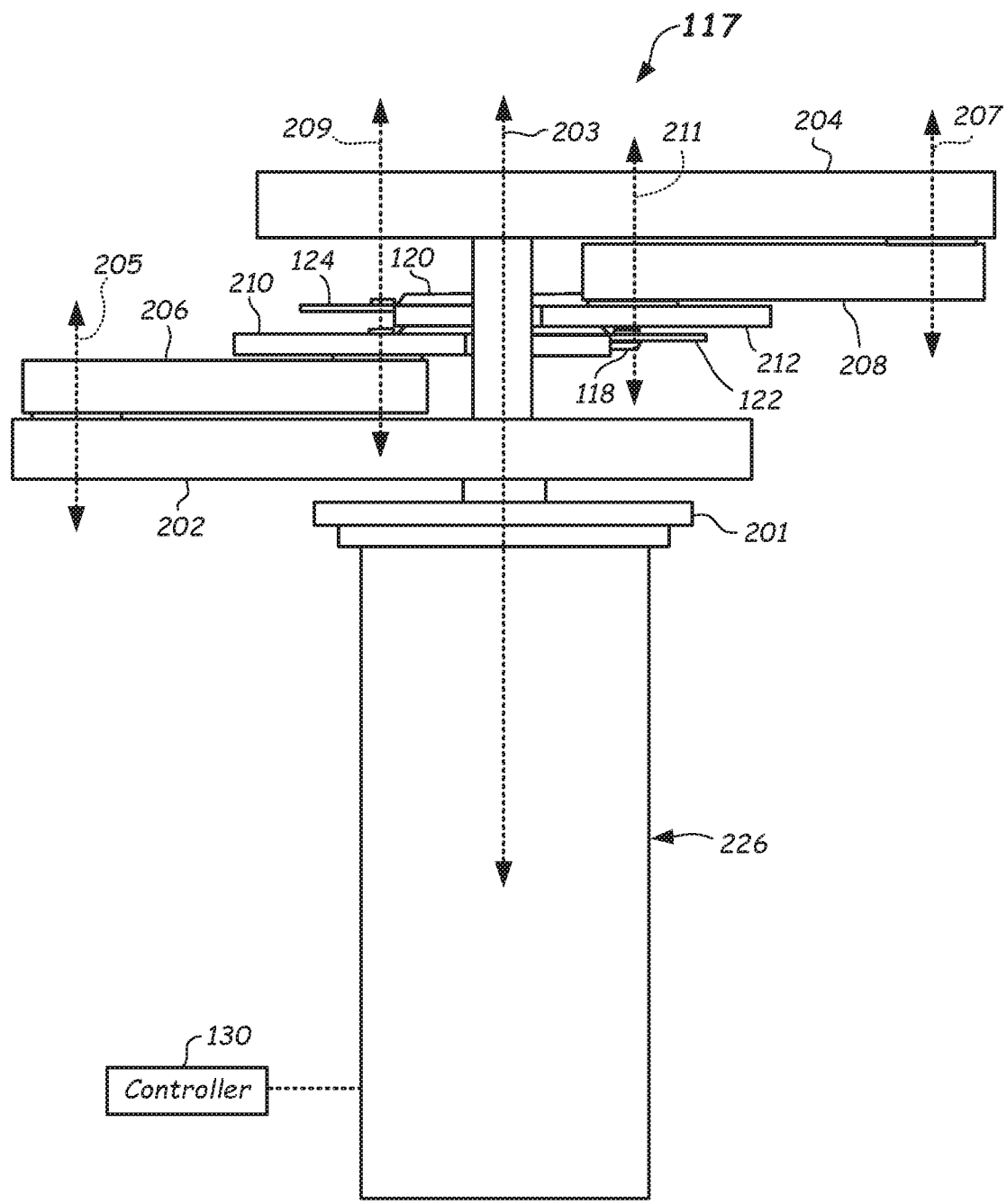
FIG. 2C illustrates a rear plan view of a dual robot according to one or more embodiments.
Figure 2D:
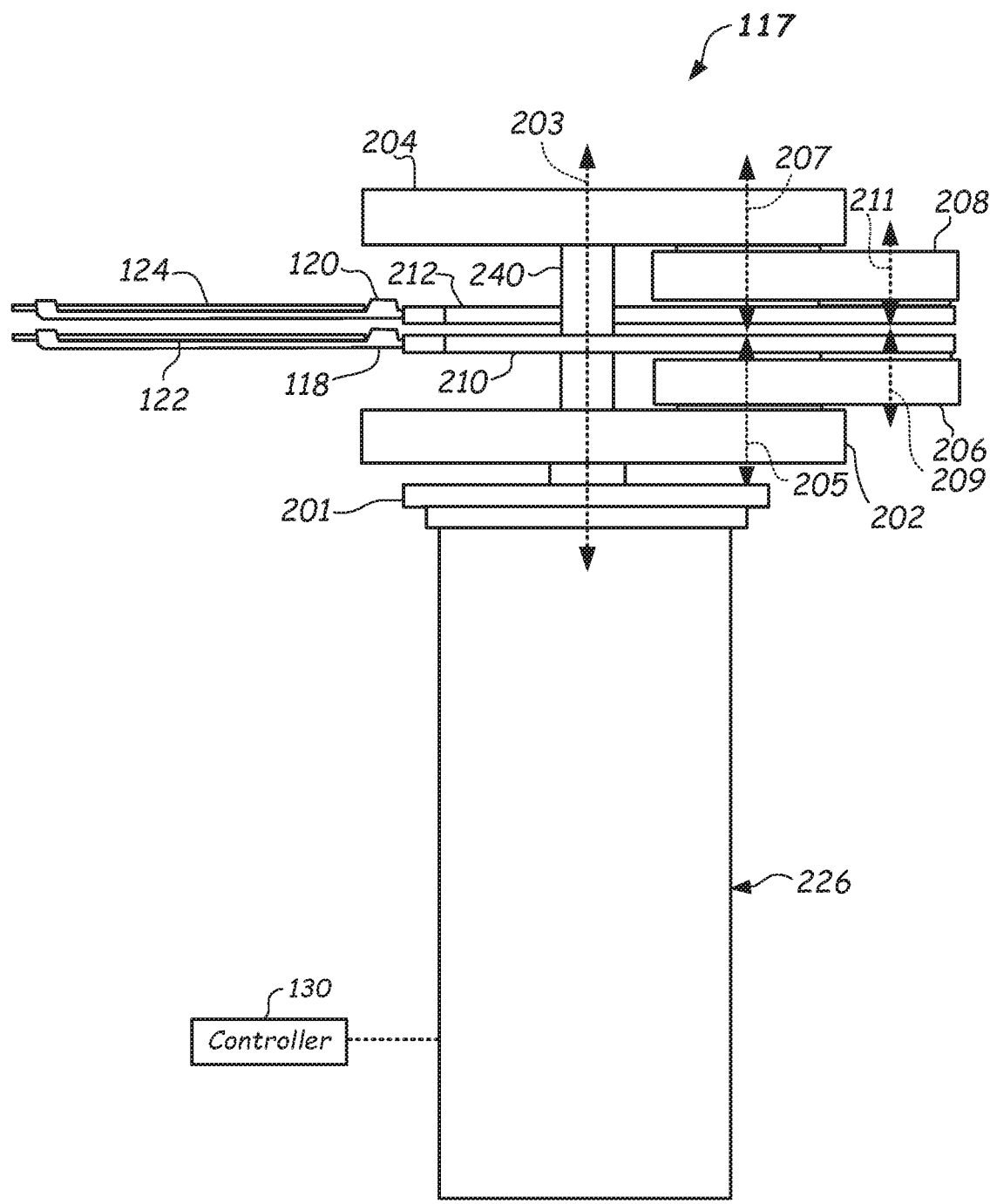
FIG. 2D illustrates a side plan view of a dual robot according to one or more embodiments.

As is shown in FIG. 2B and FIG. 2C, the first forearm 206, second forearm 208, first wrist member 210, and second wrist member 212 are all vertically received between the vertical locations of the first upper arm 202 and the second upper arm 204. Furthermore, the first upper arm 202, first forearm 206, and first wrist member 210 are all arranged below the locations of the second upper arm 204, second forearm 208, and second wrist member 212, so that interference is avoided for all rotational conditions. The robot 117 is shown in a folded, fully-retracted position in FIGS. 2A-2D. As will be described later herein, a second shaft 240 coupled to the second upper arm 204 extends vertically between the first upper arm 202 and the second upper arm 204 and passes by the sides of the first and second wrist members 210, 212.

In one or more embodiments, the first upper arm 202 and first forearm 206 may be of unequal lengths, measured center-to center, i.e., measured horizontally between the shoulder axis 203 and the second axis 205 for the length of the first upper arm 202, and between the second axis 205 and the fourth axis 209 for the length of the first forearm 206. The second upper arm 204 and the second forearm 208 may also be of unequal center-to-center lengths. The center-to-center length of the second upper arm 204 may be measured between the shoulder axis 203 and the third axis 207, and between the third axis 207 and the fifth axis 211 for the length of the second forearm 208.

For example, the center-to-center lengths of the first upper arm 202 and the second upper arm 204 may be between about 110% and 200% larger than the center-to-center lengths of the first forearm 206 and second forearm 208, respectively. In one or more embodiments, the lengths of the first and second upper arms 202, 204 may be between about 200 mm and about 380 mm. The lengths of the first and second forearms 206, 208 may be between about 100 mm and 345 mm.

The details of the motor assembly 226 and various drive assemblies will now be described with reference to FIGS. 2E and 2F. The rotation of the first upper arm 202 in the X-Y plane about shoulder axis 203 may be provided by a first upper arm drive assembly. First upper arm drive assembly includes a first motor 228 configured to rotate a first shaft 229, which is coupled to a bottom of the first upper arm 202. The first motor 228 may be a stepper motor, variable reluctance motor, a permanent magnet electric motor, or the like. Other types of motors may be used. The rotation of the first upper arm 202 may be independently controlled by suitable commands provided to the first motor 228 from a controller 130. Controller 130 may provide positional commands to each of the respective drive motors and may receive positional feedback information from suitable positional encoders via a wiring harness 231. The first upper arm 202 may be rotated freely +/−360 degrees or more.

The first motor 228 may be contained in a motor housing 232, which may be coupled to a base 201, for example. The base 201 may be coupled to a floor of a mainframe housing 180. Any suitable type of feedback device may be provided to determine a precise rotational position of the first upper arm 202. For example, a first encoder 236 may be coupled to the first shaft 229. The first encoder 236 may be a rotary encoder and may be a magnetic type, an optical type, or another type of encoder. In some embodiments, the motor housing 232 and base 201 may be made integral with one another. In other embodiments, the base 201 may be made integral with the mainframe housing 180.

Likewise, the independent rotation of the second upper arm 204 in the X-Y plane about the shoulder axis 203 may be provided by a second upper arm drive assembly. The second upper arm drive assembly may include a second motor 238 rotating a second shaft 240, wherein the second shaft is rigidly coupled to the second upper arm 204, such as at an upper portion thereof, as shown. The second motor 238 may be a stepper motor, variable reluctance motor, permanent magnet electric motor, or the like. Other types of motors may be used. The rotation of the second upper arm 204 may be independently controlled by suitable commands provided to the second motor 238 from the controller 130. Controller 130 may also receive positional feedback information from a second encoder 242 via the wiring harness 231. Rotation of the first upper arm 202 and the second upper arm 204 may be up to about +140 degrees from the fully retracted position shown in FIG. 2A.

Rotation of the first forearm 206 in the X-Y plane about the second axis 205 may be provided by any suitable motive member, such as by an action of a third motor 244 rotating a third shaft 245. The third motor 244 may be the same as discussed above. The rotation of the first forearm 206 may be independently controlled by suitable commands provided to the third motor 244 from the controller 130. Controller 130 may also receive positional feedback information from a third encoder 246 coupled to the third shaft 245 via the wiring harness 231.

A first forearm drive assembly may comprise any suitable structure for rotationally driving the first forearm 206. The first forearm drive assembly may include, for example, a rotor of the third motor 244 coupled to and capable of driving the third shaft 245. The first forearm drive assembly may further include a first forearm driving member 247, a first forearm driven member 248, and a first forearm transmission element 249. The first forearm driving member 247 may be coupled to the third shaft 245, whereas the first forearm driven member 248 may be a cylindrical pilot extending from a body of the first forearm 206. For example, in the depicted embodiment, the first forearm driving member 247 may be a cylindrical pulley coupled to or integral with the third shaft 245 or simply a cylindrical end of the third shaft 245, as shown. The first forearm transmission element 249 connects the first forearm driving member 247 and first forearm driven member 248. The first forearm transmission element 249 may be one or more belts or straps, such as two oppositely-wound discontinuous metal straps, wherein each strap is rigidly coupled (e.g., pinned) to the first forearm driving member 247 and first forearm driven member 248 at the ends thereof.

In the depicted embodiment, the first wrist member drive assembly includes a first wrist member driving member 250, which comprises a cam surface 250S, as best shown in FIG. 2F, and a first wrist member driven member 252 connected by a first wrist member transmission element 254. The first wrist member driving member 250 may be an oblong pulley including a cam surface 250S. The first wrist member driving member 250 may be rigidly coupled to the first upper arm 202, such as at its lower end, by a first forearm shaft 255. Other types of rigid connections may be used. Likewise, the first wrist member driven member 252 may be an oblong pulley including a cam surface 252S.

The cam surfaces 250S, 252S (FIG. 2F) of the first wrist member driving member 250 and the first wrist member driven member 252 may be configured so that rate of rotation of the first wrist member 210 is nonlinear. Thus, even though the lengths of the first upper arm 202 and the first forearm 206 are unequal, the first wrist member 210 and the coupled first end effector 118 may be driven in pure translation in the Y direction (See FIG. 2B). In particular, the cam surfaces 250S, 252S, and thus the rate of rotation, is related to a center-to-center length L1 of the first upper arm 202 and a center-to-center length L2 of the first forearm 206. The relationship between a minimum cam radius R1 to a maximum cam radius R2 may be selected based upon the lengths of the first and second upper arms 202, 204 and first and second forearms and so that a constant belt length may be provided during rotation. The trajectory for the first and second end effectors 118, 120 may be linear in some embodiments, or optionally may be sweeping in some embodiments depending upon the chosen cam profile. The cam surfaces 250S and 252S should be oriented so that the positions of the lobes having the maximum radius are oriented 90 degrees from one another. Other lobe shapes may be used. The lobe profile, in one embodiment, is such that the first end effector 118 always travels in a linear path along the Y axis in extension and retraction. The second wrist member drive assembly configured to drive the second wrist member 212 is identical to the above-described first wrist member drive assembly.

The first wrist member driven member 252 may be coupled to a pilot extending from a body of the first wrist member 210. The first wrist member transmission element 254 may be one or more belts. In some embodiments, the one or more belts may be discontinuous first and second steel belts, as described above, oppositely wrapped about the first wrist member driving member 250 and the first wrist member driven member 252.

In more detail, the first wrist member 210 includes an offset such that a first portion extends from the fourth axis 209 to the fourth shaft 268 as shown in FIG. 2B, and then juts right around the fourth shaft 268 so that the end effector line of action 256 (shown as a dotted line) of the center of the first end effector 118 is offset from the fourth axis line of action 258 (also shown dotted). The offset distance 260 between the end effector line of action 256 and the fourth axis line of action 258 may be between about 25 mm and 200 mm, and about 125 mm in some embodiments, for example. A similar offset jutting left around fourth shaft 268 may be provided on the second wrist member 212 such that the second end effector 120 is offset in the same manner as shown.

The operation of the second forearm 208 and second wrist member 212 may be the same as previously described for the first forearm 206 and first wrist member 210.

Figure 2E:
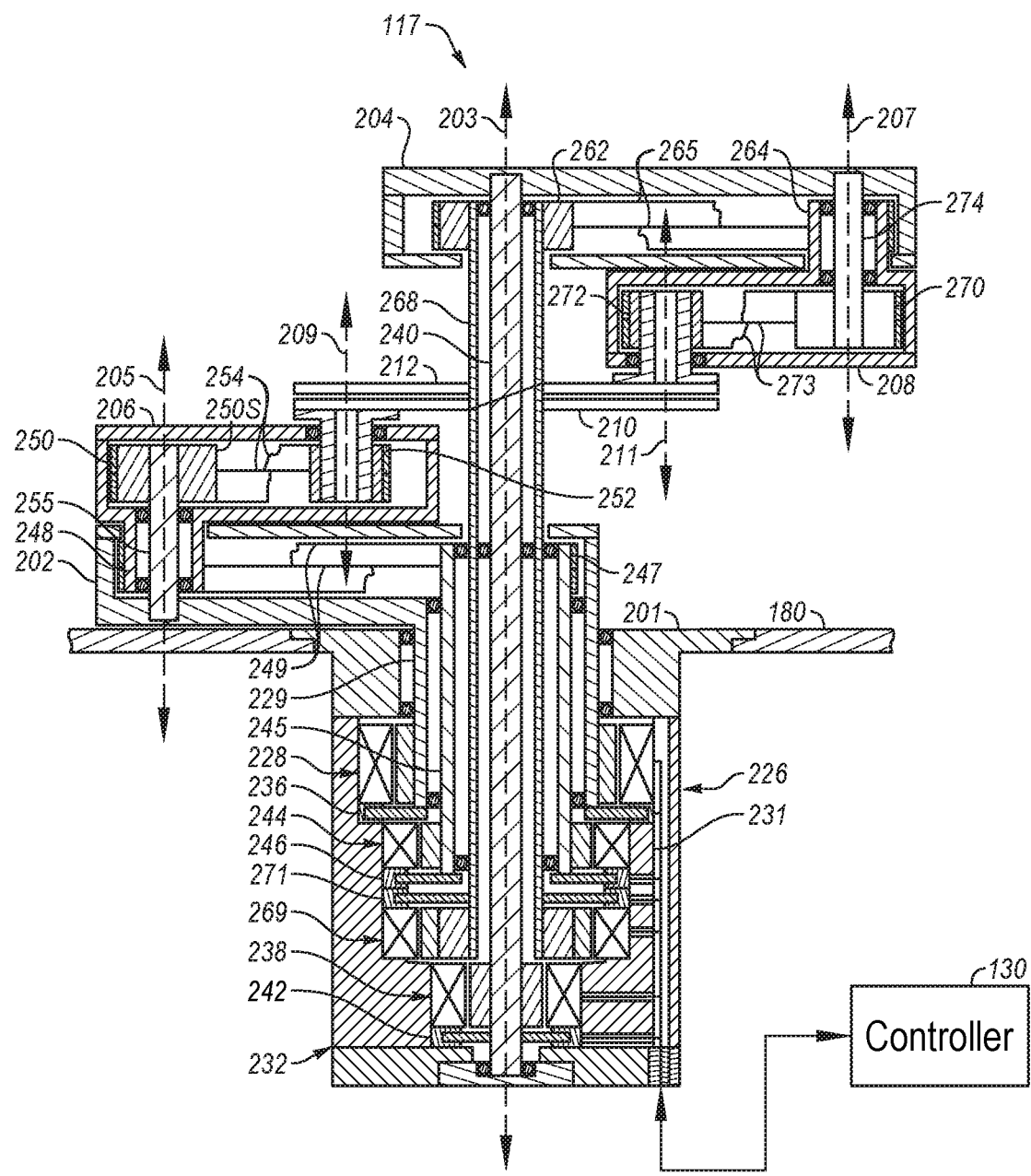
FIG. 2E illustrates a cross-sectioned side view of a dual robot showing the drive components according to one or more embodiments.
Figure 2F:
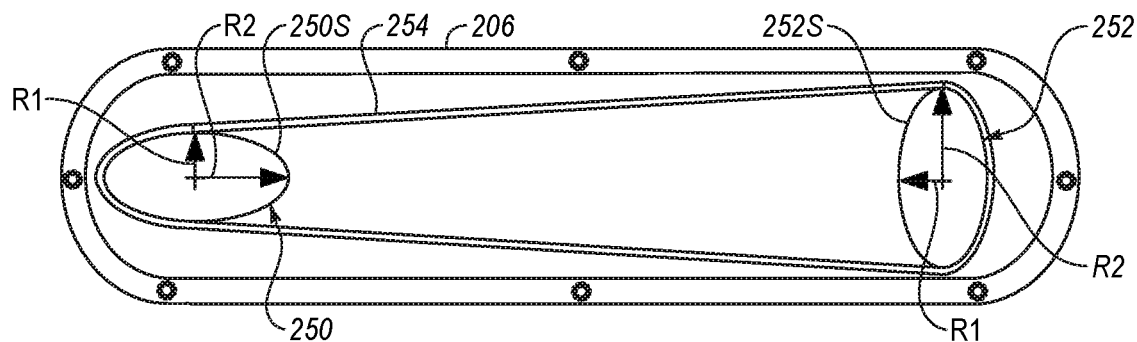
FIG. 2F illustrates a top view of a dual robot showing the forearm drive components according to one or more embodiments.

The second forearm drive assembly includes, as best shown in FIG. 2E, a second forearm driving member 262 and a second forearm driven member 264 connected by a second forearm transmission element 265. The second forearm driving member 262 may be a cylindrical pulley rigidly coupled to the fourth shaft 268, for example. The fourth shaft 268 may be driven by a fourth motor 269, which may be a same motor as discussed above. A fourth encoder 271 may provide feedback to controller 130 of the exact positioning of the fourth shaft 268. The second forearm driven member 264 may be a pilot extending upwardly from a body of the second forearm 208, such as at an upper end thereof. The second forearm transmission element 265 may be one or more belts. In some embodiments, the one or more belts may be first and second discontinuous steel belts wrapped about the second forearm driving member 262 and the second forearm driven member 264 in opposite directions wherein each belt is pinned at its respective ends to each of the second forearm driving member 262 second forearm driven member 264. The rotation of the second forearm 208 about the third axis 207 is provided by action of the second forearm drive assembly.

In the depicted embodiment, the second wrist member drive assembly includes, as best shown in FIGS. 2E and 2F, a second wrist member driving member 270 and a second wrist member driven member 272 connected by a second wrist member transmission element 273. The second wrist member driving member 270 may be a cam rigidly coupled to the second upper arm 204, such as at its upper end by a second forearm shaft 274. Other types of rigid connections may be used. The second wrist member driven member 272 may be a cam coupled to a pilot extending upwardly from a body of the second wrist member 212. The second wrist member transmission element 273 may be one or more belts. In some embodiments, the one or more belts may be first and second discontinuous steel belts, as described above, oppositely wrapped about the second wrist member driving member 270 and the second wrist member driven member 272.

The shafts 229, 240, 245, and 268, and first and second forearms 206, 208, and first and second wrist members 210, 212 may be supported for rotation by suitable rotation-accommodating bearings. Any suitable bearing may be used, such as ball bearings. For example, sealed ball bearings may be used.

In operation, in order to move the second end effector 120 to a desired destination for a pick or place of the substrate 124, the second upper arm 204 and second forearm 208 may be actuated a sufficient amount, thereby translating the second wrist member 212, to pick or place the substrate 124 from a chamber. As the second end effector 120 coupled to the second wrist member 212 is inserted into a chamber (FIG. 1) to place the substrate 124 at a desired destination location, moving lift pins may raise to contact the substrate 124 and lift the substrate 124 off of the end effector 120 so that the end effector 120 may be retracted.

Figure 2G:
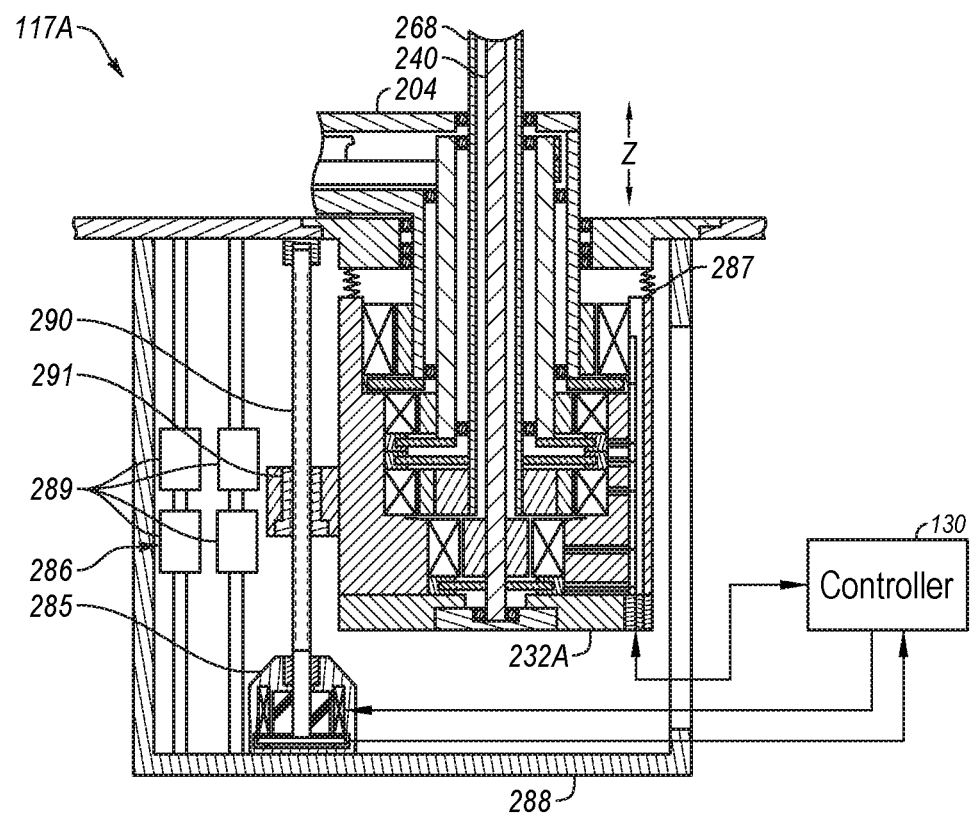
FIG. 2G illustrates a cross-sectioned partial side view of a motor assembly including Z-axis capability according to one or more embodiments.

FIG. 2G illustrates a portion of a robot 117A that may further include a vertical motor 285 and a vertical drive mechanism 286 that is configured and adapted to cause vertical motion (along the Z axis) of the first and second upper arms 202, 204 (only first upper arm 202 shown), and coupled first and second forearms 206, 208 (not shown), first and second wrist members 210, 212 (not shown), and first end effector 118 and the second end effector 120 (not shown). The first and second upper arms 202, 204, first and second forearms 206, 208, first and second wrist members 210, 212, and first and second end effectors 118, 120 may be the same as described in the FIG. 2A-2G embodiment.

The vertical drive mechanism 286 may include a worm drive, lead screw, ball screw, or rack and pinion mechanism that, when rotated by the vertical motor 285, causes the motor housing 232A to translate vertically along the Z direction. A vacuum barrier 287 (e.g., a sealed bellows) may be used to accommodate the vertical motion and also act as a vacuum barrier between the chamber housing the robot arms and the inside of the outer housing 288 that may be at atmospheric pressure. One or more translation-accommodating devices 289, such as linear bearings, bushings, or other linear motion-restraining means may be used to restrain the motion of the outer housing 288 to vertical motion only along the Z direction. In the depicted embodiment, a lead screw 290 may engage a lead nut 291 mounted to the motor housing 232A. Vertical motor 285 may include a rotational feedback to provide vertical position feedback information to the controller 130.

Figures 3A, 3B:
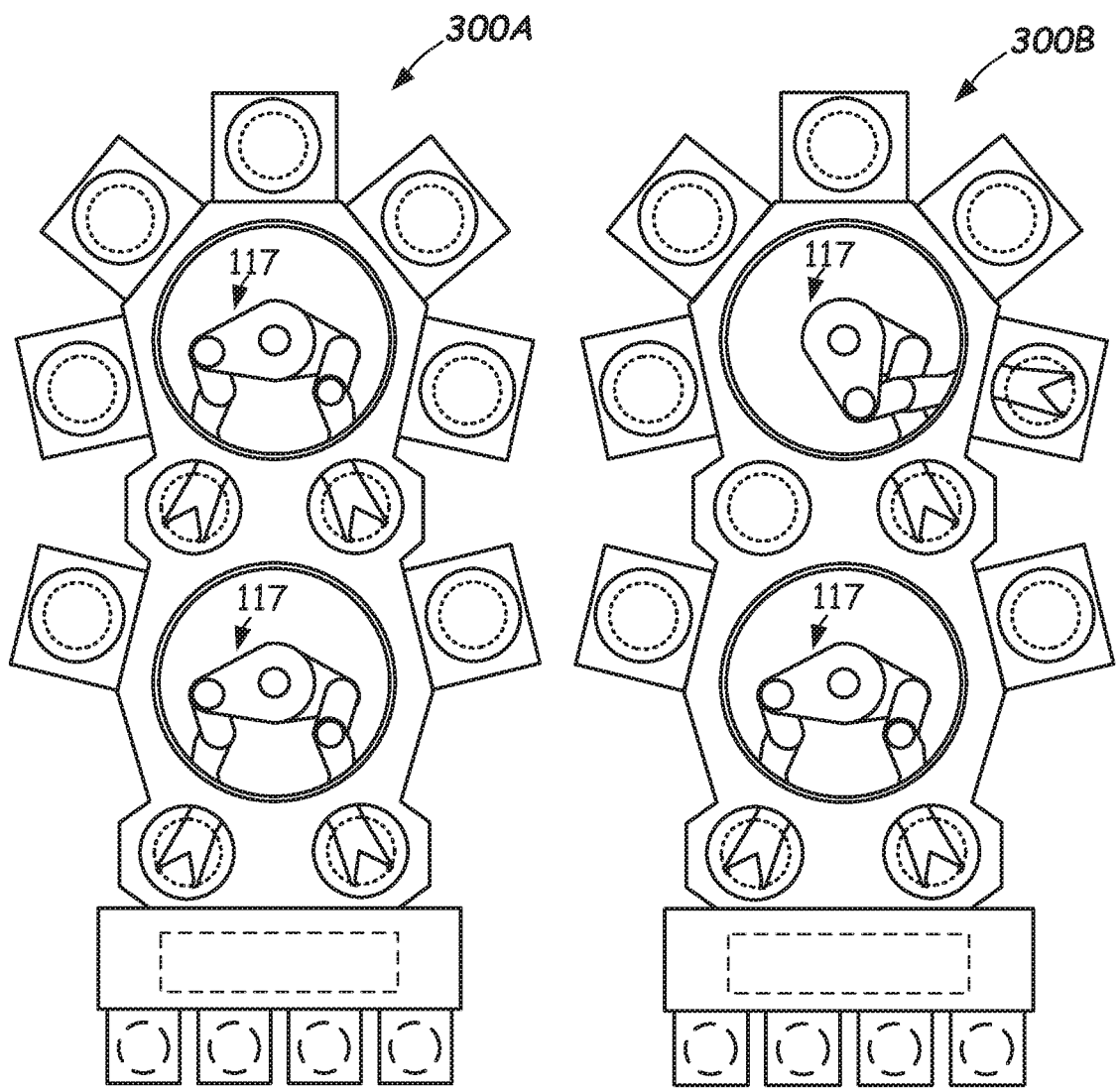
FIG. 3A-3D illustrates top views of an electronic device processing system including two dual robots shown in various configurations according to one or more embodiments.
Figures 3C, 3D:
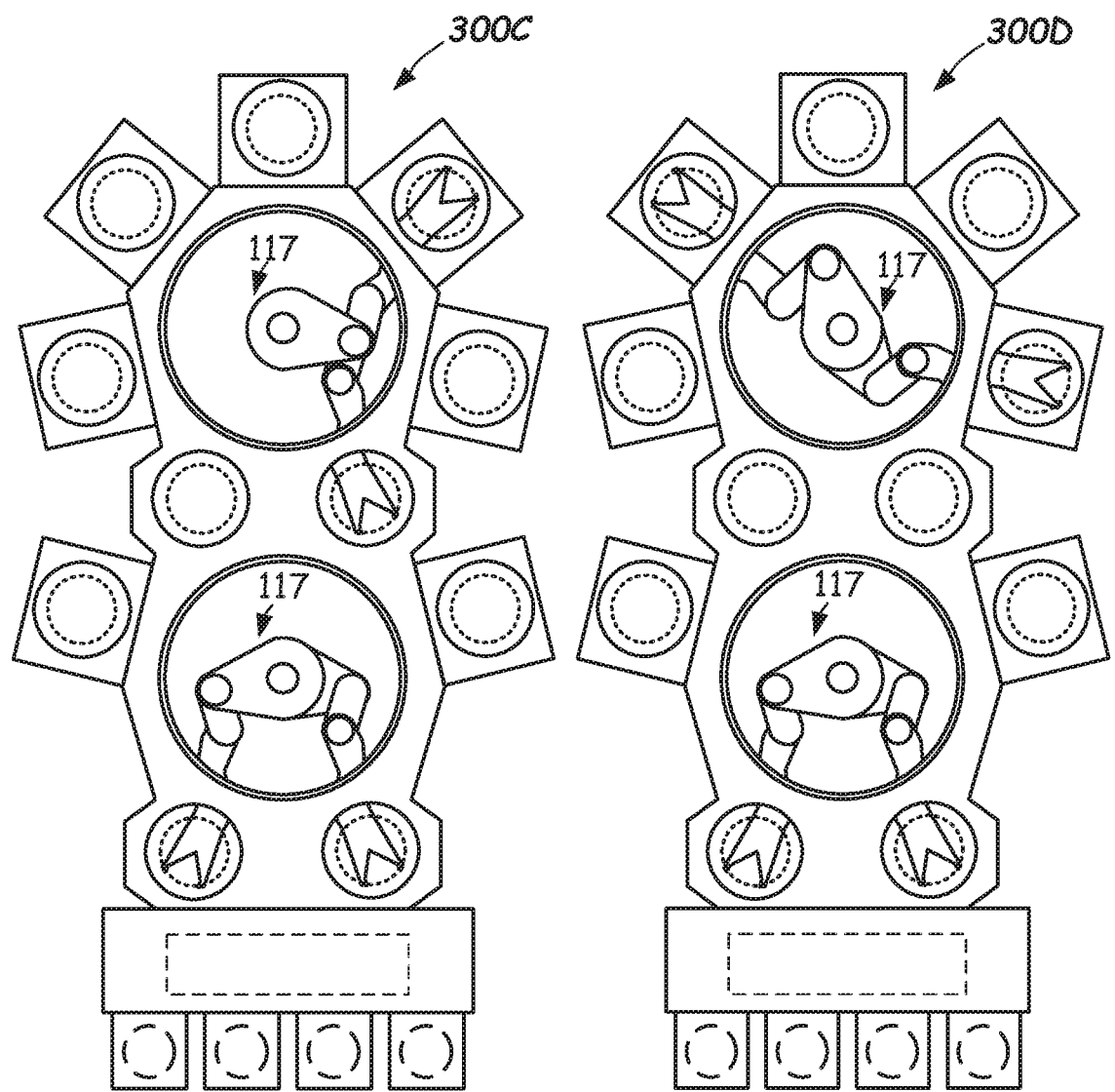

FIGS. 3A-3D illustrate electronic device processing systems 300A-300D including multiple mainframes, each including a robot 117. Various configurations of the robot are shown to illustrate the extreme flexibility in servicing the various chambers. For example, FIG. 3A illustrates the robots 117 each servicing the load lock chambers and via pass through chambers, respectively. FIGS. 3B and 3C illustrate the robots 117 servicing the load lock chambers, a via chamber, and a process chamber. FIG. 3D illustrates the robots 117 servicing the load lock chambers, and process chambers.

Figure 4:
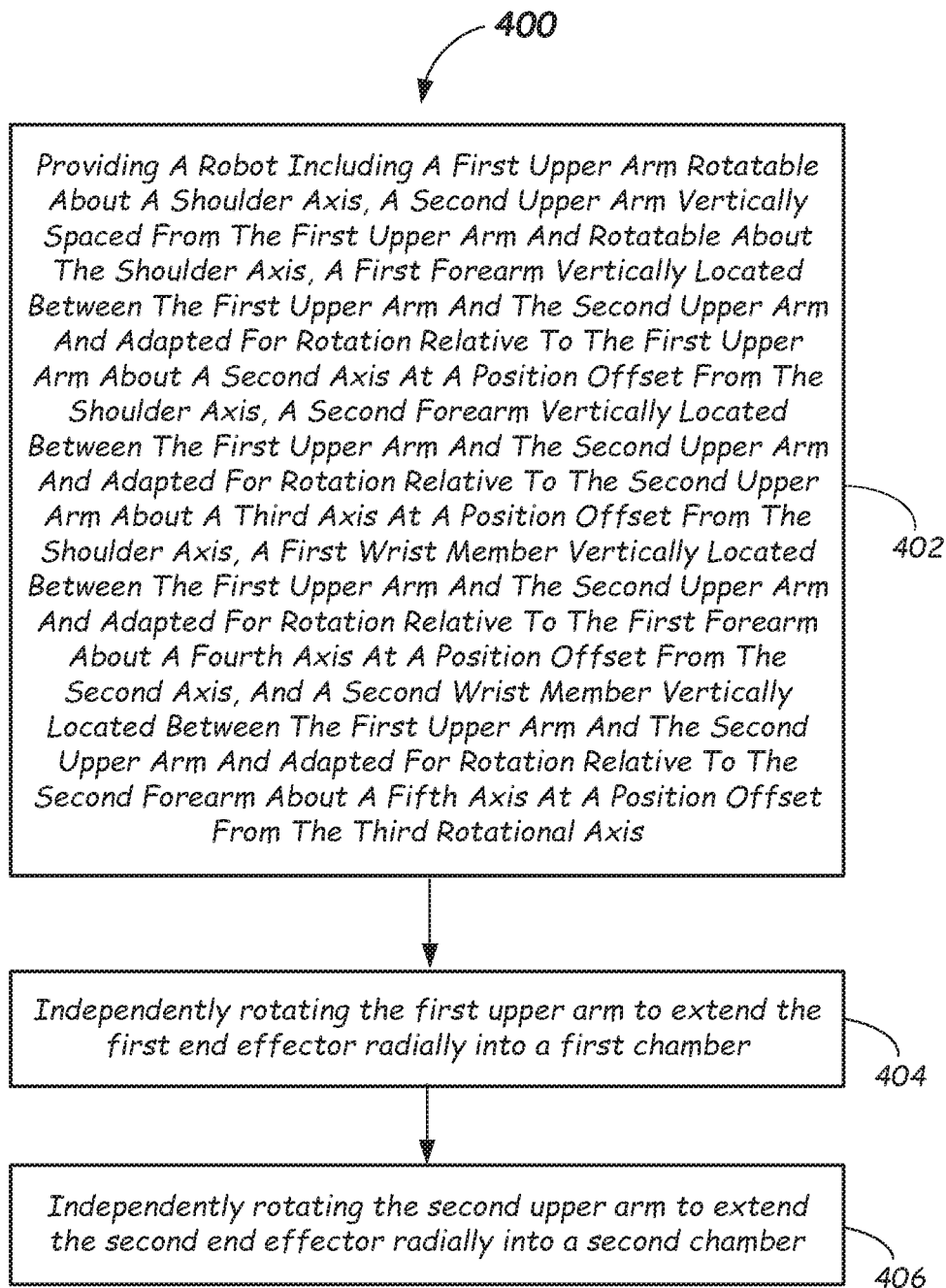
FIG. 4 illustrates a flowchart depicting a method of transporting substrates within an electronic device processing system according to one or more embodiments.

A method 400 of transporting substrates within an electronic device processing system according to embodiments is provided and described with reference to FIG. 4. The method 400 includes, in 402, providing a robot (e.g., robot 117) including a first upper arm (e.g., first upper arm 202) rotatable about a shoulder axis (e.g., shoulder axis 203), a second upper arm (e.g., second upper arm 204) vertically spaced from the first upper arm and rotatable about the shoulder axis, a first forearm (e.g., first forearm 206) vertically located between the first upper arm and the second upper arm and adapted for rotation relative to the first upper arm about a second axis (e.g., second axis 205) at a position offset from the shoulder axis, a second forearm (e.g., second forearm 208) vertically located between the first upper arm and the second upper arm and adapted for rotation relative to the second upper arm about a third axis (e.g., third axis 207) at a position offset from the shoulder axis, a first wrist member (e.g., first wrist member 210) vertically located between the first upper arm and the second upper arm and adapted for rotation relative to the first forearm about a fourth axis (e.g., fourth axis 209) at a position offset from the second axis, and a second wrist member (e.g., second wrist member 212) vertically located between the first upper arm and the second upper arm and adapted for rotation relative to the second forearm about a fifth axis (e.g., fifth axis 211) at a position offset from the third axis.

In 404, the method 400 includes independently rotating the first upper arm to extend a first end effector (e.g., first end effector 118) radially into a first chamber, and further, in 406, independently rotating the second upper arm to extend a second end effector (e.g., second end effector 120) radially into a second chamber.

As should be apparent, using the robot 117 as described herein, picking and placing of substrates may be accomplished in reduced time, thus enhancing overall tool throughput. The foregoing description discloses only example embodiments. Modifications of the above-disclosed apparatus, systems, and methods which fall within the scope of the disclosure will be readily apparent to those of ordinary skill in the art. Accordingly, while the present disclosure has been provided in connection with example embodiments thereof, it should be understood that other embodiments may fall within the scope, as defined by the appended claims.

The invention claimed is:

1. A robot, comprising:
    a first upper arm rotatable about a shoulder axis, wherein the first upper arm is a first single cantilever beam;
    a second upper arm vertically spaced above the first upper arm and rotatable about the shoulder axis, wherein the second upper arm is a second single cantilever beam;
    a first forearm attached to the first upper arm and vertically located between the first upper arm and the second upper arm, the first forearm adapted for rotation relative to the first upper arm about a second axis at a position offset from the shoulder axis;
    a second forearm attached to the second upper arm and vertically located between the first forearm and the second upper arm, the second forearm adapted for rotation relative to the second upper arm about a third axis at a position offset from the shoulder axis;
    a first wrist member attached to the first forearm and vertically located between the first forearm and the second forearm, the first wrist member adapted for rotation relative to the first forearm about a fourth axis at a position offset from the second axis; and
    a second wrist member attached to the second forearm and vertically located between the first wrist member and the second forearm, the second wrist member adapted for rotation relative to the second forearm about a fifth axis at a position offset from the third axis.

2. The robot of claim 1, further comprising:
    a first end effector coupled to the first wrist member; and
    a second end effector coupled to the second wrist member.

3. The robot of claim 1, further comprising a first upper arm drive assembly comprising:
    a first motor; and
    a first shaft coupled to the first motor and to the first upper arm and adapted to cause independent rotation of the first upper arm.

4. The robot of claim 1, further comprising a second upper arm drive assembly comprising a second shaft coupled to a second motor and the second upper arm, the second shaft passing along a side of the first wrist member and the second wrist member and adapted to cause independent rotation of the second upper arm.

5. The robot of claim 1, further comprising a first forearm drive assembly comprising:
    a third motor;
    a third shaft coupled to the third motor and to a first forearm pulley;
    a first forearm pilot coupled to the first forearm; and
    a first forearm belt coupled between the first forearm pulley and the first forearm pilot.

6. The robot of claim 5, further comprising a first wrist member drive assembly comprising:
    a first forearm shaft rigidly coupled to the first upper arm and to a first wrist member pulley;
    a first wrist member cam coupled to the first wrist member; and
    a first wrist member belt coupled between the first wrist member pulley and the first wrist member cam.

7. The robot of claim 6, wherein the first wrist member pulley and the first wrist member cam each include a cam surface.

8. The robot of claim 1, further comprising a second forearm drive assembly comprising:
    a fourth motor;
    a fourth shaft coupled to the fourth motor and to a second forearm pulley;
    a second forearm pilot coupled to the second forearm; and
    a second forearm belt coupled between the second forearm pulley and the second forearm pilot.

9. The robot of claim 1, further comprising a second wrist member drive assembly comprising:
    a second forearm shaft rigidly coupled to the second upper arm and to a second wrist member pulley;
    a second wrist member cam coupled to the second wrist member; and
    a second wrist member belt coupled between the second wrist member pulley and the second wrist member cam.

10. The robot of claim 9, wherein the second wrist member pulley and the second wrist member cam each include a cam surface.

11. The robot of claim 1, wherein the first forearm includes a different center-to-center length than the first upper arm, and the second forearm includes a different center-to-center length than the second upper arm.

12. The robot of claim 1, further comprising a first end effector coupled to the first wrist member and a second end effector coupled to the second wrist member, wherein the first end effector is moveable along a first path and the second end effector is moveable along a second path and wherein the first path and the second path do not overlap.

13. The robot of claim 1, further comprising:
    a shaft assembly configured to rotate at least one of the first upper arm and the second upper arm;
    a first bend in the first wrist member; and
    a second bend in the second wrist member,
    wherein the first bend and the second bend each at least partially bend around the shaft assembly when the robot is in a retracted position.

14. The robot of claim 1, wherein the first upper arm has a first length, the first forearm has a second length, and the first length is greater than the second length, and wherein the second upper arm has a third length, the second forearm has a fourth length, and the third length is greater than the fourth length.

15. The robot of claim 14, wherein the first length is between 110% and 200% greater than the second length, and the third length is between 110% and 200% greater than the fourth length.

16. The robot of claim 1, further comprising:
a first upper arm drive assembly comprising a first motor and a first shaft coupled to the first motor and the first upper arm, wherein the first upper arm drive assembly is adapted to cause independent rotation of the first upper arm; and
a second upper arm drive assembly comprising a second motor and a second shaft coupled to the second motor and the second upper arm, wherein the second upper arm drive assembly is adapted to cause independent rotation of the second upper arm.

17. The robot of claim 16, further comprising a forearm drive assembly comprising:
a forearm drive motor;
a forearm drive shaft coupling the forearm drive motor to a forearm pulley;
a forearm pilot; and
a forearm belt coupled between the forearm pulley and the forearm pilot.

18. The robot of claim 16, further comprising a shaft assembly comprising the second shaft and a forearm drive shaft, wherein the first wrist member and second wrist member are spaced on either side of the shaft assembly.

19. An electronic device processing system, comprising:
a transfer chamber;
a robot at least partially disposed in the transfer chamber and adapted to transport substrates to and from process chambers coupled to the transfer chamber, the robot including:
a first upper arm rotatable about a shoulder axis, wherein the first upper arm is a first single cantilever beam;
a second upper arm vertically spaced above the first upper arm and rotatable about the shoulder axis, wherein the second upper arm is a second single cantilever beam;
a first forearm attached to the first upper arm and vertically located between the first upper arm and the second upper arm, the first forearm adapted for rotation relative to the first upper arm about a second axis at a position offset from the shoulder axis;
a second forearm attached to the second upper arm and vertically located between the first forearm and the second upper arm, the second forearm adapted for rotation relative to the second upper arm about a third axis at a position offset from the shoulder axis;
a first wrist member attached to the first forearm and vertically located between the first forearm and the second forearm, the first wrist member adapted for rotation relative to the first forearm about a fourth axis at a position offset from the second axis; and
a second wrist member attached to the second forearm and vertically located between the first wrist member and the second forearm the second wrist member adapted for rotation relative to the second forearm about a fifth axis at a position offset from the third axis.

20. A method of transporting substrates within an electronic device processing system, comprising:
providing a robot including a first upper arm rotatable about a shoulder axis, wherein the first upper arm is a first single cantilever beam, a second upper arm vertically spaced from the first upper arm and rotatable about the shoulder axis, wherein the second upper arm is a second single cantilever beam, a first forearm attached to the first upper arm and vertically located between the first upper arm and the second upper arm, the first forearm adapted for rotation relative to the first upper arm about a second axis at a position offset from the shoulder axis, a second forearm attached to the second upper arm and vertically located between the first forearm and the second upper arm, the second forearm adapted for rotation relative to the second upper arm about a third axis at a position offset from the shoulder axis, a first wrist member attached to the first forearm and vertically located between the first forearm and the second forearm, the first wrist member adapted for rotation relative to the first forearm about a fourth axis at a position offset from the second axis, and a second wrist member attached to the second forearm and vertically located between the first wrist member and the second forearm, the second wrist member adapted for rotation relative to the second forearm about a fifth axis at a position offset from the third axis;
independently rotating the first upper arm to extend a first end effector radially into a first chamber; and
independently rotating the second upper arm to extend a second end effector radially into a second chamber.

* * * * *